(12) United States Patent
Murakami et al.

(10) Patent No.: US 11,211,225 B2
(45) Date of Patent: Dec. 28, 2021

(54) CHARGED PARTICLE BEAM CONTROL DEVICE

(71) Applicant: Hitachi High-Tech Corporation, Tokyo (JP)

(72) Inventors: Shinichi Murakami, Tokyo (JP); Makoto Suzuki, Tokyo (JP); Shunsuke Mizutani, Tokyo (JP); Akio Yamamoto, Tokyo (JP); Wen Li, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 0 days.

(21) Appl. No.: 16/996,123

(22) Filed: Aug. 18, 2020

(65) Prior Publication Data

US 2021/0066033 A1 Mar. 4, 2021

(30) Foreign Application Priority Data

Aug. 27, 2019 (JP) .............................. JP2019-154512

(51) Int. Cl.
*H01J 37/26* (2006.01)
*H01J 37/244* (2006.01)
*H01J 37/28* (2006.01)

(52) U.S. Cl.
CPC .......... *H01J 37/265* (2013.01); *H01J 37/244* (2013.01); *H01J 37/28* (2013.01); *H01J 2237/2448* (2013.01); *H01J 2237/2817* (2013.01)

(58) Field of Classification Search
CPC .......... H01J 37/00; H01J 37/02; H01J 37/265; H01J 37/244; H01J 37/2822; H01J 37/222; H01J 37/248; H01J 37/26; H01J 37/261; H01J 2237/2817; H01J 2237/2448; H01J 2237/281; H01J 2237/24495; H01J 2237/2444
USPC .......................................... 250/306, 307, 311
See application file for complete search history.

(56) References Cited

U.S. PATENT DOCUMENTS

| | | | | |
|---|---|---|---|---|
| 2008/0197280 | A1* | 8/2008 | Tanaka | G01N 23/225 250/306 |
| 2008/0308725 | A1* | 12/2008 | Ominami | G01R 31/307 250/306 |
| 2017/0345615 | A1* | 11/2017 | Zotta | H01J 37/02 |
| 2020/0286708 | A1* | 9/2020 | Wang | H01L 27/14665 |

FOREIGN PATENT DOCUMENTS

| JP | 2003-303867 A | 10/2003 |
|---|---|---|
| JP | 2008-311364 A | 12/2008 |

* cited by examiner

*Primary Examiner* — Jason L McCormack
(74) *Attorney, Agent, or Firm* — Miles & Stockbridge, P.C.

(57) ABSTRACT

Provided is a charged particle beam control device having improved signal detection accuracy. The charged particle beam control device (detection block) includes: a detector provided in a charged particle beam device, and configured to detect secondary electrons emitted from a sample by irradiating the sample with a charged particle beam and output an electric signal based on the detected secondary electrons; a signal wiring configured to transmit the electric signal; a noise detection wiring configured to detect a noise signal generated in the charged particle beam device; and an arithmetic circuit configured to generate a signal obtained by subtracting the noise signal from the electric signal.

17 Claims, 10 Drawing Sheets

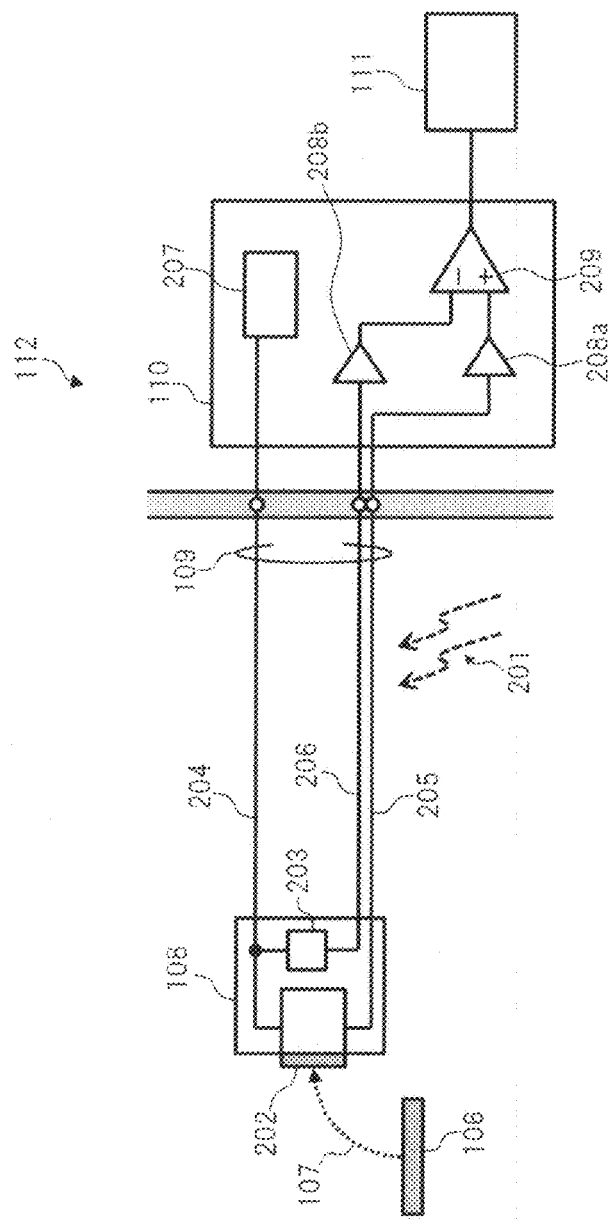

CHARGED PARTICLE BEAM CONTROL DEVICE

BACKGROUND OF THE INVENTION

1. Field of the Invention

The present invention relates to a charged particle beam control device.

2. Description of the Related Art

A charged particle beam control device represented by a scanning electron microscope or the like is a device that irradiates a sample with a charged particle beam and converts reflected electrons and secondary electrons from the sample into electrical signals with detectors such as scintillators and photomultiplier tubes to perform dimension measurement or the like on a fine pattern such as a semiconductor pattern formed on the sample through an amplifier circuit, an arithmetic processing circuit, and a display.

In recent years, with progress of three-dimensionalization of the semiconductor pattern, it is required to measure dimensions of a deep groove or a deep hole with high accuracy. Most of electrons emitted from a bottom of the deep groove or the deep hole collide with a side surface of the groove or the hole and are scattered, so a detection amount of the electrons decreases and a detection signal becomes weak. When a noise generated in the device is superimposed on the detection signal, a signal-to-noise ratio (SNR) is extremely reduced, and accuracy of the dimension measurement is reduced.

A method for reducing a noise component is disclosed in, for example, JP-A-2008-311364. JP-A-2008-311364 discloses a detection circuit including an antenna that detects an electromagnetic wave noise in addition to a main detector that detects a signal component emitted from a sample. The detection circuit detects a main signal component emitted from the sample by the main detector, while detecting the electromagnetic waves generated by local discharge or the like in the sample as the noise component by the antenna and subtracting the noise component from the signal component.

However, the method for reducing the noise disclosed in JP-A-2008-311364 is not sufficient. For example, a noise generated in the device may be mixed in a signal wiring between the detector and an amplifier circuit, but the configuration in JP-A-2008-311364 cannot remove the noise mixed in the signal wiring.

SUMMARY OF THE INVENTION

An object of the invention is to provide a charged particle beam control device having improved signal detection accuracy.

In the invention disclosed in the application, an outline of a typical configuration will be briefly described as follows.

A charged particle beam control device according to a representative embodiment of the invention includes: a detector provided in a charged particle beam device, and configured to detect secondary electrons emitted from a sample by irradiated the sample with a charged particle beam and output an electric signal based on the detected secondary electrons; a signal wiring configured to transmit the electric signal; a noise detection wiring configured to detect a noise signal generated in the charged particle beam device; and an arithmetic circuit configured to generate a signal obtained by subtracting the noise signal from the electric signal.

Effects attained by the typical configuration of the invention disclosed in the present application will be briefly described as follows.

That is, according to the representative embodiment of the invention, signal detection accuracy can be improved.

BRIEF DESCRIPTION OF THE DRAWINGS

FIG. 2 is a diagram showing an example of a configuration of a detection block according to the first embodiment of the invention.

DESCRIPTION OF THE PREFERRED EMBODIMENTS

Figure 1:
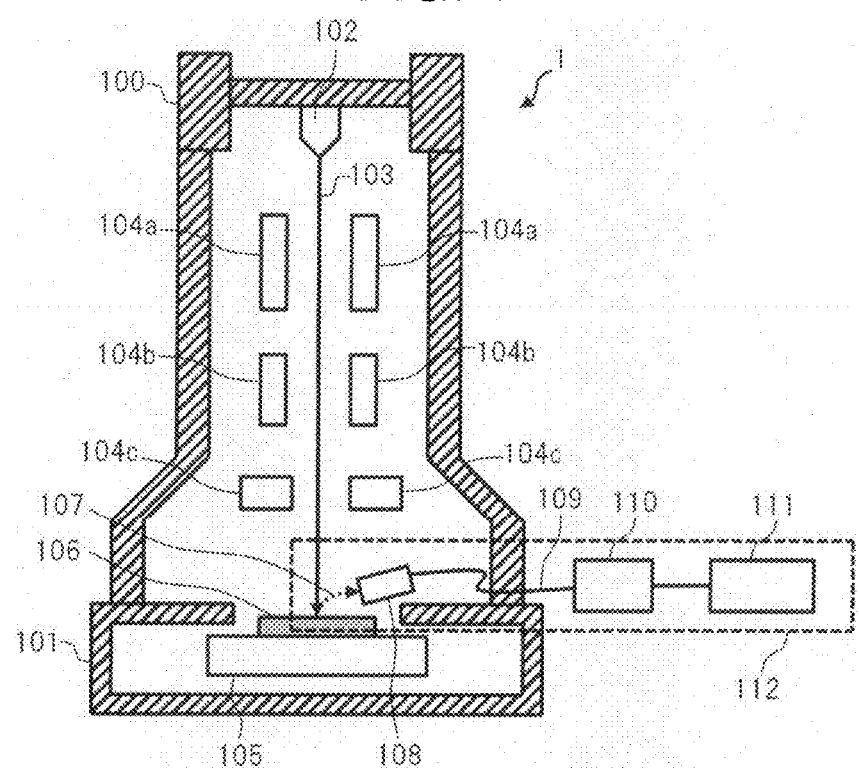
FIG. 1 is a diagram showing an example of a schematic configuration of a charged particle beam device according to a first embodiment of the invention.

Embodiments of the invention will be described below with reference to the drawings. Each embodiment described below is only an example for carrying out the invention and the technical scope of the invention is not limited thereto. In the embodiments, members having the same function are designated by the same reference numeral, and repeated description thereof will be omitted unless particularly necessary.

First Embodiment

<Configuration of Charged Particle Beam Device>

FIG. 1 is a diagram showing an example of a schematic configuration of a charged particle beam device according to the first embodiment of the invention. As shown in FIG. 1, a charged particle beam device 1 has a configuration in which a lens barrel 100 is placed on a sample chamber 101. In the sample chamber 101, a sample for inspection is accommodated. A stage 105 is disposed inside the sample chamber 101, and a sample 106 is set on the stage 105. Meanwhile, inside the lens barrel 100, an electron gun 102, deflectors 104a to 104c, a detector 108 and the like are provided. An interior of the lens barrel 100 and the sample chamber 101 is vacuum exhausted by a vacuum pump (not shown) to maintain a vacuum state.

An arithmetic circuit 110 and a data processing unit 111 are provided outside the lens barrel 100 and the sample chamber 101. That is, the arithmetic circuit 110 and the data processing unit 111 are disposed under an atmospheric pressure environment. The detector 108 and the arithmetic circuit 110 are connected to each other by a wiring cable 109. The detector 108, the arithmetic circuit 110, and the data processing unit 111 constitute a detection block (charged particle beam control device) 112 that processes an electric signal. The wiring cable 109 includes a power supply line 204, a signal wiring 205, and a noise detection wiring 206. These wirings will be described later in detail. The charged particle beam device 1 and the detection block 112 may be collectively referred to as a charged particle beam device.

The electron gun 102 irradiates the sample 106 disposed in the device with an electron beam (charged particle beam) 103. The deflectors 104a to 104c deflect the electron beam 103 emitted from the electron gun 102, so that the sample 106 is scanned with the electron beam 103. The detector 108 detects an electron emitted from the sample 106 by performing irradiation with the electron beam 103 as a secondary electron 107, and outputs the electric signal based on the detected secondary electron 107 to the arithmetic circuit 110 via the signal wiring 205. The secondary electrons 107 include secondary electrons, reflected electrons, and the like.

<Configuration of Detection Block>

«Detector»

FIG. 2 is a diagram showing an example of a configuration of a detection block according to the first embodiment of the invention. As shown in FIG. 2, the detector 108 includes a main detector 202 that detects the secondary electrons 107 emitted from the sample 106, and a termination circuit 203.

The main detector 202 is constituted by combining, for example, a scintillator that converts the incident secondary electrons 107 into light and a semiconductor element such as a silicon photomultiplier (SiPM) that uses an avalanche photodiode in Geiger mode. In this case, the secondary electrons 107 emitted from the sample 106 are converted into the light by the scintillator. The light is incident to the SiPM, converted into the electric signal, and output as the electric signal.

Instead of the SiPM, the main detector 202 may include a photomultiplier tube including a plurality of electrodes in a vacuum tube, and may include an electron multiplier that can directly convert the incident secondary electrons 107 into the electric signal.

The power supply line 204 and the signal wiring 205 are respectively connected to the main detector 202. The main detector 202 receives power supply from a bias power supply 207 (described later) in the arithmetic circuit 110 via the power supply line 204. The main detector 202 supplies the electric signal to a preamplifier 208a in the arithmetic circuit 110 via the signal wiring 205.

The power supply line 204 and the noise detection wiring 206 are respectively connected to the termination circuit 203. The termination circuit 203 adjusts an input impedance between the power supply line 204 and the noise detection wiring 206 based on an input impedance between the power supply line 204 and the signal wiring 205 that are connected to the main detector 202. Specifically, the termination circuit 203 adjusts the input impedance between the power supply line 204 and the noise detection wiring 206 such that the input impedance between the power supply line 204 and the noise detection wiring 206 and the input impedance between the power supply line 204 and the signal wiring 205 coincide.

The termination circuit 203 may be configured in advance based on the measured input impedance between the power supply line 204 and the signal wiring 205. Alternatively, the termination circuit 203 may be formed by modifying the current configuration based on the input impedance, which is measured during operation, between the power supply line 204 and the signal wiring 205. The termination circuit 203 includes, for example, any one of a diode, a resistance element, a capacitor (capacitance element), an inductor, and a variable capacitance element as a circuit component.

FIGS. 3A to 3J are diagrams showing configuration examples of the termination circuit. In FIGS. 3A to 3I, 301 is a power supply terminal connected to the power supply line 204, and 302 is an output terminal connected to the noise detection wiring 206.

Figure 3A:
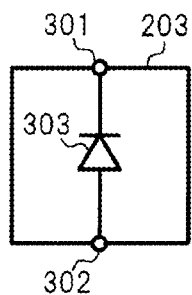
FIGS. 3A to 3J are diagrams showing configuration examples of a termination circuit.
Figure 3B:
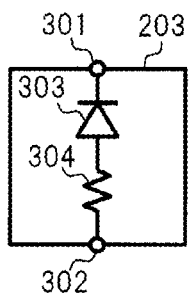

FIG. 3A shows a configuration when a diode 303 is used as the circuit component. The diode 303 in FIG. 3A includes a side of an anode connected to the output terminal 302 and a side of a cathode connected to the power supply terminal 301. The diode 303 may be a photodiode or a general rectifier diode. FIG. 3B shows a configuration when the diode 303 and a resistance element 304 are used as the circuit components. In an example in FIG. 3B, the resistance element 304 is connected between the anode of the diode 303 and the output terminal 302. As the resistance element 304, for example, an element having a resistance value of approximately 100 kΩ to 10 MΩ is used.

Figure 3C:
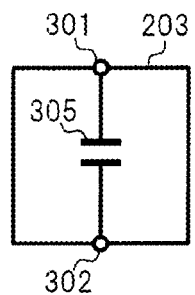
Figure 3D:
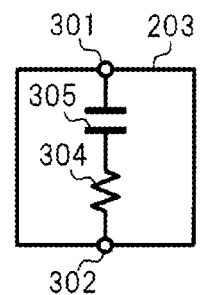

FIG. 3C shows a configuration when a capacitor 305 is used as the circuit component. The capacitor 305 in FIG. 3C includes one electrode connected to the power supply terminal 301 and another electrode connected to the output terminal 302. As the capacitor 305, for example, an element having a capacitance value of approximately 1 pF to 1000 pF is used. FIG. 3D shows a configuration when the capacitor 305 and the resistance element 304 are used as the circuit components. In an example in FIG. 3D, the resistance element 304 is connected between the other electrode of the capacitor 305 and the output terminal 302.

Figure 3E:
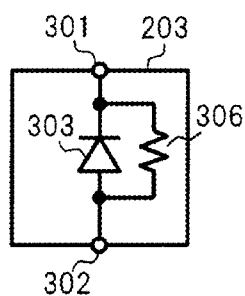
Figure 3F:
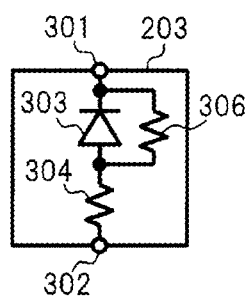
Figure 3G:
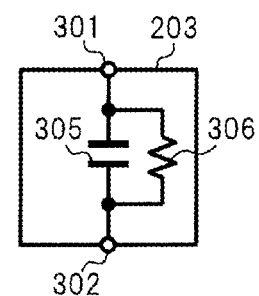
Figure 3H:
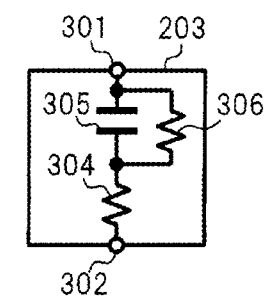

As compared with that in FIGS. 3A and 3B, in FIGS. 3E and 3F, a resistance element 306 is connected in parallel with the diode 303. As the resistance element 306, for example, an element having a resistance value of approximately 10 MΩ to 1 GΩ is used. As compared with that in FIGS. 3C and 3D, in FIGS. 3G and 3H, the resistance element 306 is connected in parallel with the capacitor 305.

Figure 3I:
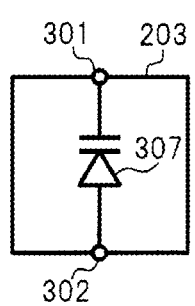
Figure 3J:
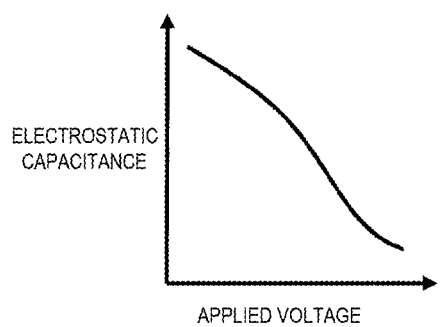

FIG. 3I shows a configuration when a variable capacitance element 307 such as a variable capacitance diode or a variable capacitance capacitor is used as the circuit component. The variable capacitance element 307 changes a capacitance thereof according to a voltage applied to the power supply terminal 301. FIG. 3J is a diagram showing an example of a relationship between the applied voltage and an electrostatic capacitance when the variable capacitance diode is used as the variable capacitance element 307. FIG. 3J shows the relationship in which the capacitance decreases as the applied voltage increases as an example. It is desirable that the variable capacitance element 307 such as the variable capacitance diode and the main detector 202 have the same relationship between the applied voltage and the electrostatic capacitance.

The variable capacitance element 307 adjusts a frequency characteristic of the input impedance between the power supply line 204 and the noise detection wiring 206 by changing the capacitance according to the voltage applied to the power supply terminal 301. Accordingly, the termination circuit 203 can adjust the input impedance between the power supply line 204 and the noise detection wiring 206 according to a fluctuation in frequency such that the input impedance between the power supply line 204 and the noise detection wiring 206 and the input impedance between the power supply line 204 and the signal wiring 205 coincide.

The termination circuit 203 is not limited to these configurations, and may be configured with, for example, the SiPM or the photomultiplier tube provided in the main detector 202. In this case, the impedance between the power supply line 204 and the noise detection wiring 206 and the impedance between the power supply line 204 and the signal wiring 205 coincide more easily as compared with the case where each circuit component shown in FIGS. 3A to 3I is used. When the SiPM or the photomultiplier tube is used for the termination circuit 203, it is desirable that shielding processing be performed so that the light is not incident into a photocathode. Accordingly, the secondary electrons 107 to be originally detected by the main detector 202 are less likely to be mixed into noise, and a decrease in signal detection accuracy can be prevented.

«Arithmetic Circuit and Data Processing Unit»

The arithmetic circuit 110 is a functional block that executes various types of arithmetic processing for the electric signal including arithmetic processing related to noise removal. As shown in FIG. 2, the arithmetic circuit 110 includes the bias power supply 207, preamplifiers 208a and 208b, a differential amplifier circuit 209, and the like. The bias power supply 207 is connected to the main detector 202 and the termination circuit 203 via the power supply line 204, and supplies a power supply voltage required for driving the main detector 202 and the termination circuit 203.

The preamplifier 208a includes an input terminal connected to the main detector 202 via the signal wiring 205, and an output terminal connected to a positive-side input terminal of the differential amplifier circuit 209. The preamplifier 208a amplifies the electric signal output from the main detector 202, and outputs the amplified signal to the differential amplifier circuit 209.

The preamplifier 208b includes an input terminal connected to the termination circuit 203 via the noise detection wiring 206, and an output terminal connected to a negative-side input terminal of the differential amplifier circuit 209. The preamplifier 208b amplifies a noise signal 201 detected by the noise detection wiring 206, and outputs the amplified noise signal 201 to the differential amplifier circuit 209. The noise signal 201 detected by the noise detection wiring 206 includes various noises such as an electrostatic noise, a magnetic noise, and an electromagnetic wave noise that are generated in the charged particle beam device 1.

The preamplifiers 208a, 208b have the same input impedance.

It is desirable that the signal wiring 205 and the noise detection wiring 206 be wired as close as possible in a section from the detector 108 to the arithmetic circuit 110. As a wiring method, for example, parallel wiring in which these wirings are arranged close to each other may be used, or wiring in which these wirings are twisted, that is, a so-called twisted wire may be used.

The differential amplifier circuit 209 subtracts a noise component from the electric signal to generate a signal from which the noise component is removed. The differential amplifier circuit 209 performs subtraction processing of subtracting the amplified noise signal input to the negative-side input terminal from the amplified electric signal input to the positive-side input terminal. Then, the differential amplifier circuit 209 outputs the signal, from which the noise component is removed after the subtraction processing, to the data processing unit 111.

When switching operation is performed in the bias power supply 207, a switching noise may be mixed in the preamplifiers 208a, 208b and the differential amplifier circuit 209. Therefore, the bias power supply 207 may be provided outside the arithmetic circuit 110. That is, in this case, the bias power supply 207 is provided separately from the arithmetic circuit 110. Accordingly, the mixing of the switching noise can be prevented, the noise component can be reliably removed from the electric signal, and the signal detection accuracy can be improved.

The data processing unit 111 performs processing such as generation of an inspection image (for example, an SEM image) of the sample 106 and measurement of pattern dimensions based on the signal generated in the arithmetic circuit 110. For example, the data processing unit 111 generates image data for the inspection image and displays the inspection image on a display or the like (not shown). The data processing unit 111 may display a measurement result of the pattern dimensions and the like on the display.

The data processing unit 111 is implemented by executing a data processing program such as image generation or pattern dimension measurement in a processor such as a CPU. The data processing unit 111 may be configured with a field-programmable gate array (FPGA), an application specific integrated circuit (ASIC), or the like.

<Main Effect of Present Embodiment>

According to the present embodiment, the arithmetic circuit 110 generates the signal obtained by subtracting the noise signal 201 from the electric signal. According to this configuration, the noise mixed in the signal wiring can be removed, so that the signal detection accuracy can be improved.

According to the present embodiment, the termination circuit 203 in the detector 108 adjusts the input impedance between the power supply line 204 and the noise detection wiring 206 such that the input impedance between the power supply line 204 and the noise detection wiring 206 and the input impedance between the power supply line 204 and the signal wiring 205 coincide. According to this configuration, a level (mixed amount) of the noise signal 201 in the signal wiring 205 and the noise detection wiring 206 can be equalized, and the signal detection accuracy can be improved.

According to the present embodiment, the signal wiring 205 and the noise detection wiring 206 are the parallel wirings close to each other or the twisted wirings twisted together. According to this configuration, the level (mixed amount) of the noise signal 201 in the signal wiring 205 and the noise detection wiring 206 can be made uniform, and the signal detection accuracy can be further improved.

According to the present embodiment, the arithmetic circuit 110 includes the preamplifiers 208a, 208b respectively corresponding to the signal wiring 205 and the noise detection wiring 206, and subtracts the noise signal 201 amplified by the preamplifier 208b from the electric signal amplified by the preamplifier 208a. According to this configuration, the noise signal 201 having a low signal level can be removed, and the signal detection accuracy can be further improved.

According to the present embodiment, the bias power supply 207 is provided separately from the arithmetic circuit 110. According to this configuration, a noise such as the switching noise generated in the bias power supply 207 is reduced, so that the signal detection accuracy can be improved.

According to the present embodiment, the termination circuit 203 includes any one of the diode, the resistance element, the capacitor, the inductor, and the variable capacitance element. According to this configuration, the termination circuit 203 can be easily configured, and device cost can be reduced.

Second Embodiment

Next, the second embodiment will be described. In the present embodiment, a charged particle beam control device capable of adjusting a noise amount will be described. In the following, in principle, the description of the same parts as those in the above embodiment will be omitted.

Figure 4:
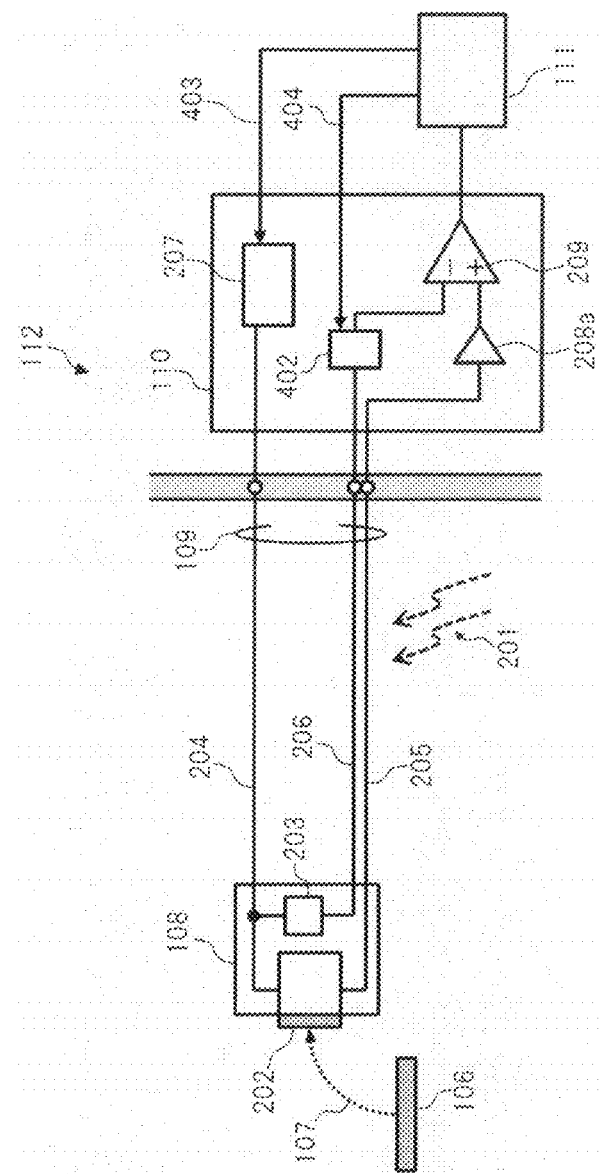
FIG. 4 is a diagram showing an example of a configuration of a detection block according to a second embodiment of the invention.
Figure 5:
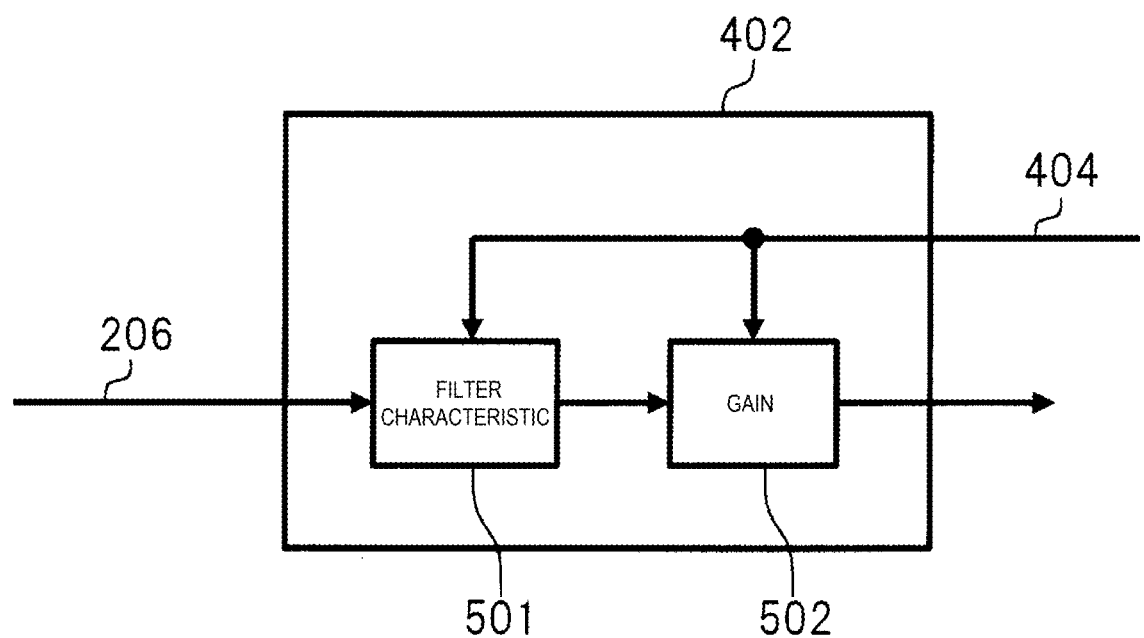
FIG. 5 is a diagram showing an example of a configuration of a noise waveform adjustment circuit.

FIG. 4 is a diagram showing an example of a configuration of a detection block according to the second embodiment of the invention. FIG. 4 is similar to FIG. 2 in configuration, but differs from FIG. 2 in that the preamplifier 208b is replaced with a noise waveform adjustment circuit 402. FIG. 5 is a diagram showing an example of a configuration of the noise waveform adjustment circuit 402. The noise waveform adjustment circuit 402 adjusts a waveform of the noise signal supplied from the noise detection wiring 206. As shown in FIG. 4, the arithmetic circuit 110 includes the bias power supply 207, the preamplifier 208a, the noise waveform adjustment circuit 402, and the differential amplifier circuit 209.

As shown in FIG. 5, the noise waveform adjustment circuit 402 includes a filter adjustment circuit 501 and a gain adjustment circuit 502. An input terminal of the filter adjustment circuit 501 is connected to the noise detection wiring 206. An output terminal of the filter adjustment circuit 501 is connected to an input terminal of the gain adjustment circuit 502. An output terminal of the gain adjustment circuit 502 is connected to the negative-side input terminal of the differential amplifier circuit 209. An input impedance of the noise waveform adjustment circuit 402 is the same as the input impedance of the preamplifier 208a.

The noise waveform adjustment circuit 402 inputs the noise signal supplied by the noise detection wiring 206 to the filter adjustment circuit 501. A noise waveform adjustment signal 404 output from the data processing unit 111 is input to the filter adjustment circuit 501 and the gain adjustment circuit 502.

The filter adjustment circuit 501 includes a low-pass filter, or a high-pass filter, or both, which can adjust a frequency characteristic of a filter. The filter adjustment circuit 501 adjusts a frequency characteristic of the noise signal based on an instruction of the noise waveform adjustment signal 404. The noise signal output from the filter adjustment circuit 501 whose frequency characteristic is adjusted is supplied to the gain adjustment circuit 502.

The gain adjustment circuit 502 includes a variable gain circuit. The gain adjustment circuit 502 amplifies the noise signal whose frequency characteristic is adjusted based on the instruction of the noise waveform adjustment signal 404, and supplies the amplified noise signal to the differential amplifier circuit 209.

The noise waveform adjustment circuit 402 includes both the filter adjustment circuit 501 and the gain adjustment circuit 502 as shown in FIG. 5, but the noise waveform adjustment circuit 402 may include only one of the filter adjustment circuit 501 and the gain adjustment circuit 502. The noise waveform adjustment circuit 402 may have a configuration in which an order of the filter adjustment circuit 501 and the gain adjustment circuit 502 is exchanged.

In addition to the various types of processing described in the first embodiment, the data processing unit 111 controls an output voltage of the bias power supply 207 with a bias power supply control signal 403. The data processing unit 111 adjusts the frequency characteristic of the filter in the filter adjustment circuit 501 and a gain in the gain adjustment circuit 502 with the noise waveform adjustment signal 404. These adjustments are performed by changing parameters of the noise waveform adjustment circuit 402.

<Parameter Setting Processing of Noise Waveform Adjustment Circuit>

Next, the parameter setting processing of the noise waveform adjustment circuit 402 will be described. Parameter changing processing described here is performed for a purpose of improving a noise removal characteristic, and is performed before measurement of the sample 106 is executed.

Figure 6:
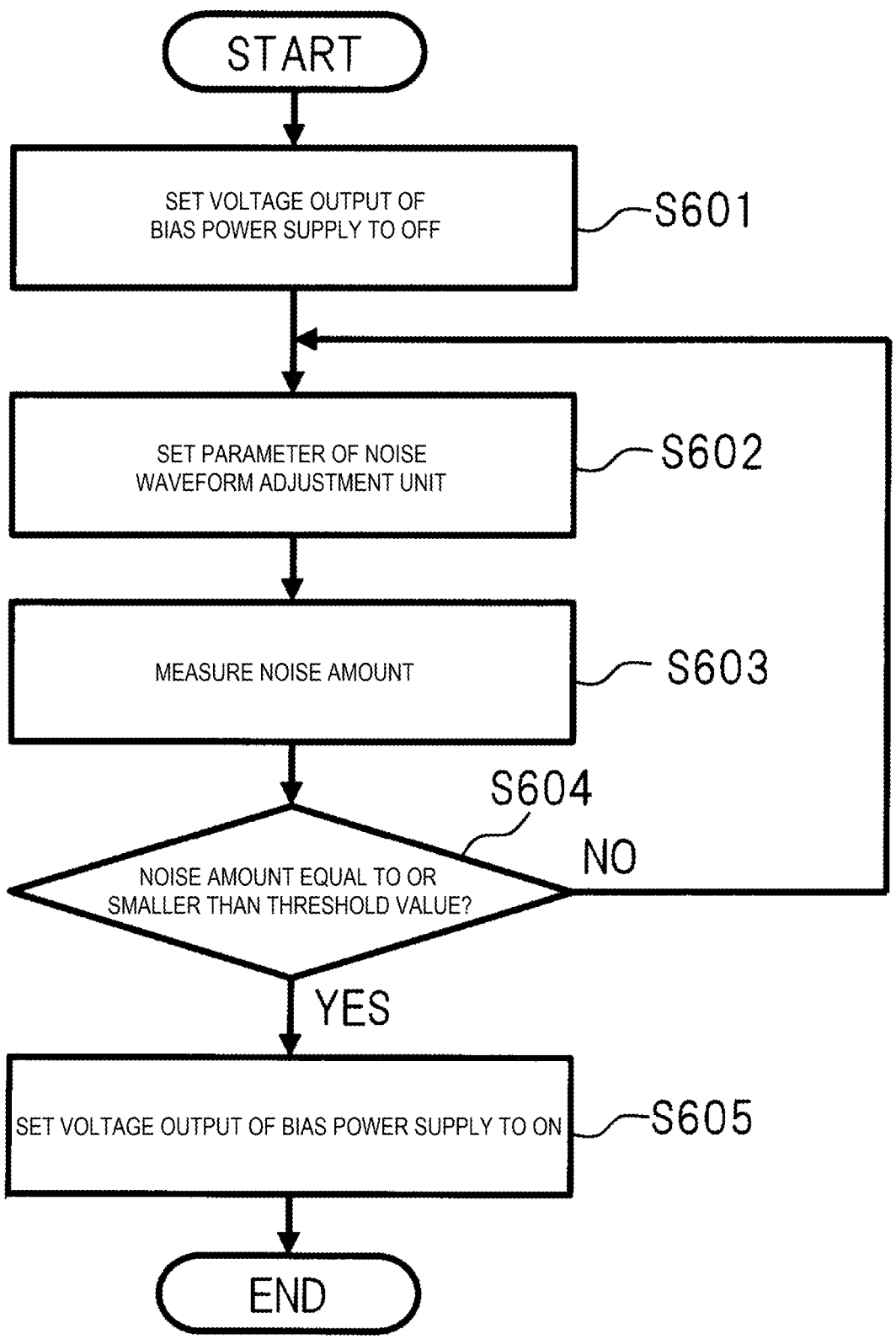
FIG. 6 is a flowchart showing an example of parameter setting processing of the noise waveform adjustment circuit.

FIG. 6 is a flowchart showing an example of the parameter setting processing of the noise waveform adjustment circuit. In an example in FIG. 6, each piece of processing in steps S601 to S605 is executed in the parameter setting processing of the noise waveform adjustment circuit.

First, in step S601, the data processing unit 111 sets voltage output of the bias power supply 207 to an off state (that is, 0 V) with the bias power supply control signal 403. Accordingly, the detector 108 does not operate, so that even when the secondary electrons 107 are incident into the detector 108, no electrical signal is output from the detector 108. However, when the secondary electrons 107 are not incident into the detector 108, such as the irradiation of the sample 106 with the electron beam 103 being stopped, the processing in step S601 may be omitted.

Next, in step S602, the data processing unit 111 sets respective parameters of the filter adjustment circuit 501 and the gain adjustment circuit 502 of the noise waveform adjustment circuit 402 with the noise waveform adjustment signal 404.

Figure 7:
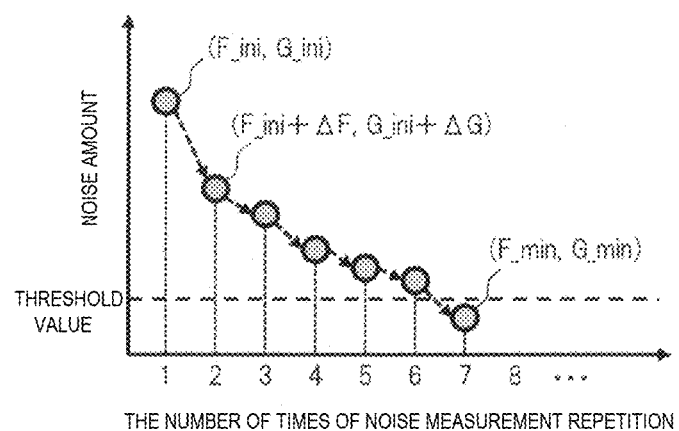
FIG. 7 is a diagram showing an example of a relationship between parameters and noise amounts.

FIG. 7 is a diagram showing an example of the relationship between the parameters and the noise amounts. A horizontal axis in FIG. 7 shows the number of times of noise measurement repetition, and a vertical axis in FIG. 7 shows the noise amounts. As shown in FIG. 7, in step S602 of a first time, a predetermined filter characteristic (F_ini) and a gain (G_ini), which are set in advance, are respectively set as initial values of the parameters.

Next, in step S603, the data processing unit 111 measures the output signal of the differential amplifier circuit 209 for a predetermined time, and measures the noise amount (detection amount of the noise signal) included in the output signal within the predetermined time. Then, the data processing unit 111 compares the measured noise amount with a predetermined threshold value set in advance (step S604).

When the measured noise amount is larger than the threshold value (NO) in step S604, the data processing unit 111 determines that a value of the parameter is not appropriate, and the processing returns to step S602 to reset the parameter. In step S602 again, as shown in FIG. 7, after the filter characteristic is changed by a width of ΔF and the gain is changed by a width of ΔG, the data processing unit 111 measures the noise amount again (step S603 again).

The data processing unit 111 repeatedly executes the processing in steps S602 to S604 until the measured noise amount becomes equal to or smaller than the threshold value. In an example in FIG. 7, after the measurement (parameter adjustment) of the noise amount is repeatedly executed seven times, the noise amount is equal to or less than the threshold value.

In step S604, when the measured noise amount is equal to or smaller than the threshold value (Yes), the data processing unit 111 determines that the value of the parameter value is appropriate, and the processing proceeds to step S605. The example in FIG. 7 shows that the filter characteristic of the filter adjustment circuit 501 is decided to F_min and a setting of the gain of the gain adjustment circuit 502 is decided to G_min.

In step S605, the data processing unit 111 sets the voltage output of the bias power supply 207 to an on state with the bias power supply control signal 403, and restarts a power supply to the detector 108.

Although illustration is omitted, an upper limit value of the number of times of repetitions of steps S602 to S604 is set. When the noise amount is not equal to or smaller than the threshold value even when the number of the times of the repetitions reaches the upper limit value, the repeating processing may be ended. In this case, a parameter having a minimum noise amount in the repeating processing may be set in the filter adjustment circuit 501 and the gain adjustment circuit 502. Alternatively, the noise amounts in combinations of the predetermined filter characteristic and a gain setting parameter may be respectively measured, and the parameter having the minimum noise amount among these noise amounts may be set in the filter adjustment circuit 501 and the gain adjustment circuit 502.

<Main Effect of Present Embodiment>

According to the present embodiment, the following effects can be attained in addition to the effects of the above embodiment.

According to the present embodiment, the noise waveform adjustment circuit 402 includes the filter adjustment circuit 501 that adjusts the frequency characteristic of the noise signal 201, and the gain adjustment circuit 502 that adjusts the gain of the noise signal 201. When the parameters of the noise waveform adjustment circuit 402 are set, the data processing unit 111 sets the output voltage of the bias power supply 207 to the off state with the bias power supply control signal 403, and sets the parameters of the noise waveform adjustment circuit 402 with the noise waveform adjustment signal 404. Then, the data processing unit 111 compares the detection amount of the measured noise signal 201 with the predetermined threshold value. When the detection amount of the noise signal 201 is larger than the threshold value, the data processing unit 111 resets the parameter, and when the detection amount of the noise signal 201 is equal to or smaller than the threshold value, the data processing unit 111 sets the voltage output of the bias power supply 207 to the on state with the bias power supply control signal 403.

According to this configuration, the noise amount included in the signal output from the differential amplifier circuit 209 can be reduced. Accordingly, high signal detection accuracy can be maintained even when there is a difference in the mixed amounts of the noise signal 201 mixed in the signal wiring 205 and the noise detection wiring 206.

Third Embodiment

Next, the third embodiment will be described. In the present embodiment, a case will be described where the secondary electrons 107 emitted from the sample 106 are detected using a plurality of detectors.

Figure 8:
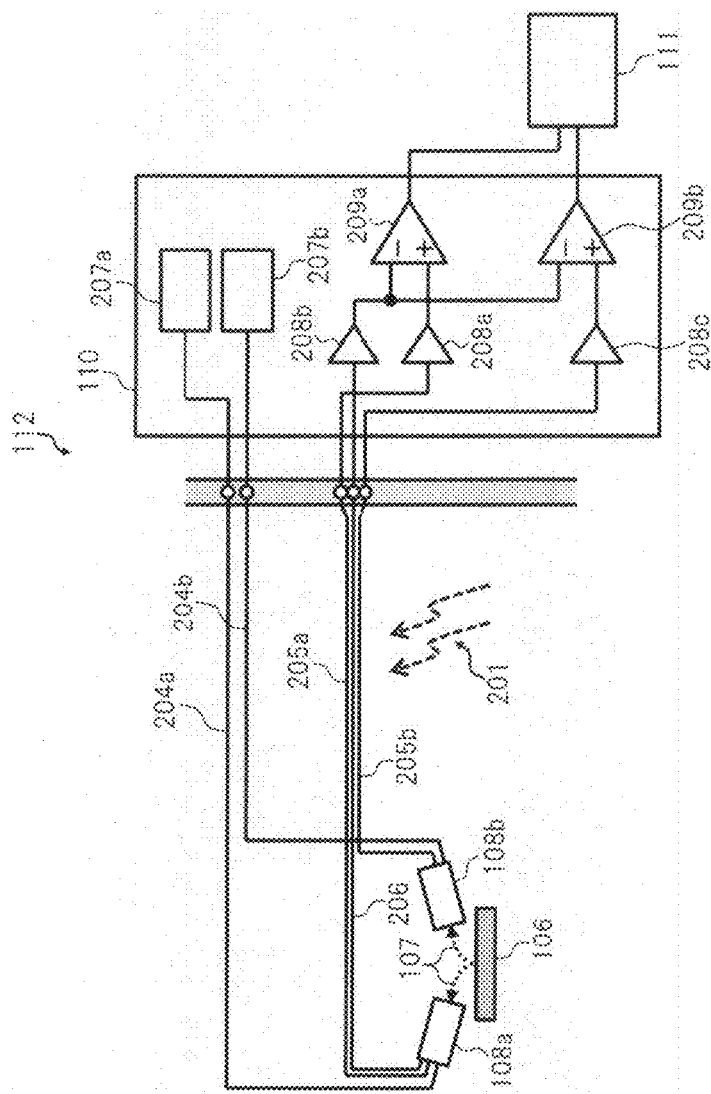
FIG. 8 is a diagram showing an example of a configuration of a detection block according to a third embodiment of the invention.

FIG. 8 is a diagram showing an example of a configuration of a detection block according to the third embodiment of the invention. FIG. 8 is similar to FIG. 2 in configuration, but is different from FIG. 2 in that a plurality of detectors, and preamplifiers, differential amplifier circuits and the like that are respectively corresponding to each detector are provided.

As shown in FIG. 8, a detection block 112 according to the present embodiment includes a plurality of detectors 108a, 108b. These detectors 108a, 108b have the same configuration as the detector 108 described with reference to FIGS. 2, 3 and the like.

The arithmetic circuit 110 is provided with a plurality of bias power supplies 207a, 207b respectively corresponding to the detectors 108a, 108b. The arithmetic circuit 110 includes a plurality of preamplifiers 208a, 208c respectively corresponding to the detectors 108a, 108b, a preamplifier 208b corresponding to the noise detection wiring 206, and a plurality of differential amplifier circuits 209a, 209b respectively corresponding to the detectors 108a, 108b. The preamplifiers 208a, 208b, 208c have the same input impedance.

The detector 108a is connected to the bias power supply 207a via a power supply line 204a, and is connected to an input terminal of the preamplifier 208a via a signal wiring 205a. An output terminal of the preamplifier 208a is connected to a positive-side input terminal of the differential amplifier circuit 209a. The detector 108a is connected to an input terminal of the preamplifier 208b via the noise detection wiring 206. Therefore, the detector 108a operates by receiving power supply from the bias power supply 207a.

Similarly, the detector 108b is connected to the bias power supply 207b via a power supply line 204b, and is connected to an input terminal of the preamplifier 208c via a signal wiring 205b. An output terminal of the preamplifier 208c is connected to a positive-side input terminal of the differential amplifier circuit 209b. Therefore, the detector 108b operates by receiving power supply from the bias power supply 207b. The noise detection wiring 206 is not connected to the detector 108b.

An output terminal of the preamplifier 208b connected to the noise detection wiring 206 is connected to respective negative-side input terminals of the differential amplifier circuits 209a, 209b. The differential amplifier circuit 209a subtracts a noise component from the electric signal amplified by the preamplifier 208a to generate a signal from which the noise component is removed. Similarly, the differential amplifier circuit 209b subtracts a noise component from the electric signal amplified by the preamplifier 208b to generate a signal from which the noise component is removed. The differential amplifier circuits 209a, 209b output the generated signal to the data processing unit 111.

It is desirable that the signal wirings 205a, 205b, and the noise detection wiring 206 be wired as close as possible in a section from the detectors 108a, 108b to the arithmetic circuit 110. As a method of bringing these wirings close to one another, three wirings may be parallel wirings, or a so-called twisted wire in which these wirings are twisted may be used. Further, in order to further reduce the noise amount mixed in these wirings, it is desirable that the wirings have a same length and that the three wirings be arranged close to the detectors 108a, 108b.

Note that, in order to reduce influence of the switching noise, the bias power supplies 207a, 207b may be provided outside the arithmetic circuit 110 also in the present embodiment.

The data processing unit 111 performs processing such as the generation of the inspection image of the sample 106 and the measurement of the pattern dimensions based on the signals generated by the differential amplifier circuits 209a, 209b. As described above, the data processing unit 111 may generate the image data for the inspection image and display the inspection image on the display or the like (not shown) or display a measurement result of the pattern dimension and the like on the display.

Note that here, the case has been described where the detection block 112 is provided with two detectors and the circuits corresponding to the respective detectors are provided in the arithmetic circuit 110, but three or more detectors and corresponding circuits may be provided in the arithmetic circuit 110.

<Main Effect of Present Embodiment>

According to the present embodiment, the plurality of detectors 108a, 108b and the plurality of signal wirings 205a, 205b each corresponding to a respective one of the plurality of detectors 108a, 108b are provided. The arithmetic circuit 110 generates the signal obtained by subtracting the noise signal 201 from the electric signal with respect to each electric signal supplied from each of the detectors 108a, 108b. According to this configuration, even when a plurality of detectors are provided, a signal from which the noise signal is removed can be generated with respect to each electric signal.

According to the present embodiment, the plurality of signal wirings 205a, 205b and the noise detection wiring 206 are the parallel wirings arranged close to one another or the twisted wirings twisted together. According to this configuration, the mixed amount of the noise signal 201 in each wiring can be equalized, and the signal detection accuracy can be further improved.

In the present embodiment, only one noise detection wiring 206 is provided for the plurality of signal wirings. According to this configuration, the number of wirings can be reduced, as compared with a case where the noise detection wirings are used for each of the detectors.

Fourth Embodiment

Next, the fourth embodiment will be described. Also in the present embodiment, a case will be described where the secondary electrons 107 emitted from the sample 106 are detected using a plurality of detectors.

Figure 9:
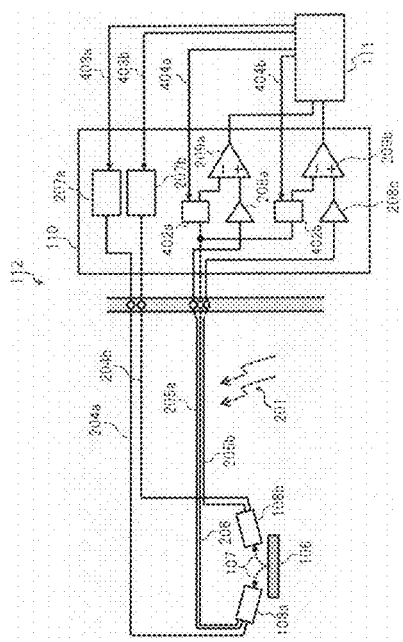
FIG. 9 is a diagram showing an example of a configuration of a detection block according to a fourth embodiment of the invention.

FIG. 9 is a diagram showing an example of a configuration of a detection block according to the fourth embodiment of the invention. FIG. 9 is similar to FIG. 8 in configuration, but is different from FIG. 8 in that noise waveform adjusting circuits 402a, 402b corresponding to each detector are provided in place of the preamplifier 208b.

The arithmetic circuit 110 is provided with the plurality of bias power supplies 207a, 207b, the plurality of preamplifiers 208a, 208c, the plurality of differential amplifier circuits 209a, 209b, and the plurality of noise waveform adjustment circuits 402a, 402b. The noise waveform adjustment circuits 402a, 402b have the same configuration as the noise waveform adjustment circuit 402 (FIGS. 4 and 5) described in the second embodiment. The preamplifiers 208a, 208c, and the noise waveform adjustment circuits 402a, 402b have the same input impedance.

The detector 108a is connected to respective input terminals of the noise waveform adjustment circuits 402a, 402b via the noise detection wiring 206. As described in the second embodiment, the noise waveform adjustment circuits 402a, 402b may include at least one of the filter adjustment circuit 501 and the gain adjustment circuit 502. Even when the noise waveform adjustment circuits 402a, 402b include both the filter adjustment circuit 501 and the gain adjustment circuit 502, the order of the filter adjustment circuit 501 and the gain adjustment circuit 502 is not particularly limited. Therefore, the noise detection wiring 206 is connected to input terminals of the circuits provided upstream of the noise waveform adjustment circuits 402a, 402b.

Meanwhile, output terminals of the noise waveform adjustment circuits 402a, 402b are respectively connected to negative-side input terminals of the corresponding differential amplifier circuits 209a, 209b. Specifically, output terminals of the circuits provided downstream of the noise waveform adjustment circuits 402a, 402b are respectively connected to the negative-side input terminals of the corresponding differential amplifier circuits 209a, 209b.

The noise waveform adjustment circuits 402a, 402b adjust the frequency characteristics and/or the gain of the noise signal based on respective instructions of noise waveform adjustment signals 404a, 404b output from the data processing unit 111. The frequency characteristic and the gain are adjusted according to the flow in FIG. 6 already described. Then, the noise waveform adjustment circuits 402a, 402b supply the adjusted noise signals to the differential amplifier circuits 209a, 209b, respectively.

It is desirable that a wiring method of the signal wirings 205a, 205b, and the noise detection wiring 206 be the same as that according to the third embodiment and that these wirings be wired as close as possible in the section from the detectors 108a, 108b to the arithmetic circuit 110.

When the frequency characteristics and the gain are adjusted, the data processing unit 111 supplies bias power supply control signals 403a, 403b for controlling the output voltages of the bias power supplies 207a, 207b to the corresponding bias power supplies 207a, 207b, respectively. When the frequency characteristic and the gain are adjusted, the data processing unit 111 supplies the noise waveform adjustment signals 404a, 404b to the corresponding noise waveform adjustment circuits 402a, 402b, respectively. The frequency characteristic adjustment and the gain adjustment for the noise waveform adjustment signals 404a, 404b may be performed in parallel, or may be performed individually.

Note that also in the present embodiment, three or more detectors and corresponding circuits may be provided in the arithmetic circuit 110.

<Effect of Present Embodiment>

According to the present embodiment, the noise waveform adjustment circuits 402a, 402b respectively corresponding to the detectors 108a, 108b are provided. According to this configuration, the noise amount included in the signal output from the arithmetic circuit 110 can be reduced for each electric signal. Accordingly, high signal detection accuracy can be maintained even when there is a difference in the mixed amounts of the noise signal 201 mixed in the signal wirings 205a, 205b and the noise detection wiring 206.

Fifth Embodiment

Figure 10:
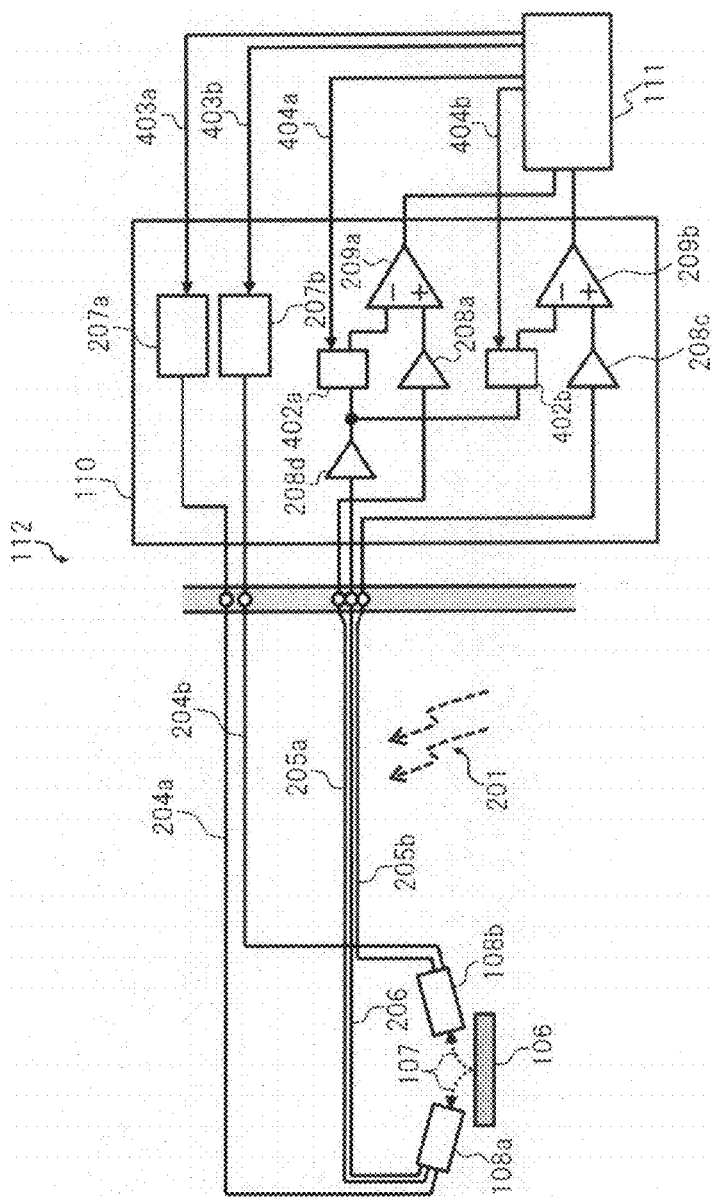
FIG. 10 is a diagram showing an example of a configuration of a detection block according to a fifth embodiment of the invention.

Next, the fifth embodiment will be described. FIG. 10 is a diagram showing an example of a configuration of a detection block according to the fifth embodiment of the invention. FIG. 10 is similar to FIG. 9 in configuration, but is different from FIG. 9 in that a preamplifier 208d is provided between the noise detection wiring 206 and the noise waveform adjustment circuits 402a, 402b.

As shown in FIG. 10, the preamplifier 208d is provided in the arithmetic circuit 110. An input terminal of the preamplifier 208d is connected to the noise detection wiring 206, and an output terminal of the preamplifier 208d is connected to the respective input terminals of the noise waveform adjustment circuits 402a, 402b. As in the case according to the fourth embodiment, the output terminal of the preamplifier 208d is connected to the input terminals of the circuits provided upstream of the noise waveform adjusting circuits 402a, 402b.

The preamplifier 208d has an input impedance which is the same as that of the preamplifiers 208a, 208c.

In the fourth embodiment, the noise waveform adjustment circuits 402a, 402b are provided such that the input impedance is the same as that of the preamplifiers 208a, 208c. However, the plurality of noise waveform adjustment circuits 402a, 402b are connected to the noise detection wiring 206. Therefore, the input impedance of the arithmetic circuit 110 which can be seen from the noise detection wiring 206 is different from the input impedance of the arithmetic circuit 110 which can be seen from the signal wirings 205a, 205b.

On the other hand, in the present embodiment, the preamplifier 208d is provided between the noise detection wiring 206 and the plurality of noise waveform adjustment circuits 402a, 402b. Accordingly, the input impedance of the arithmetic circuit 110 which can be seen from the noise detection wiring 206 can be made equal to the input impedance of the arithmetic circuit 110 which can be seen from the signal wirings 205a, 205b. Accordingly, the level of the noise signal supplied from the noise detection wiring 206 can match the level of the noise signal included in the electric signals supplied from the signal wirings 205a, 205b. Accordingly, the noise can be accurately removed from the electric signal, and the signal detection accuracy can be improved.

What is claimed is:

1. A charged particle beam device comprising:
   a detector configured to detect secondary electrons and configured to output an electric signal based on the detected secondary electrons, wherein the detected secondary electrons is emitted from a sample by irradiating the sample with a charged particle beam;
   a signal wiring configured to transmit the electric signal;
   a noise detection wiring configured to detect a noise signal generated in the charged particle beam device; and
   an arithmetic circuit configured to generate a signal obtained by subtracting the noise signal from the electric signal,
   wherein
   the detector includes a main detector configured to detect the secondary electrons, and a termination circuit,
   the main detector is connected to a power supply line and the signal wiring,
   the termination circuit is connected to the power supply line and the noise detection wiring, and
   the termination circuit is configured to adjust a frequency characteristic of an input impedance between the power supply line and the noise detection wiring based on an input impedance between the power supply line and the signal wiring.

2. The charged particle beam control device according to claim 1, wherein
   the arithmetic circuit includes a first preamplifier connected to the signal wiring and a second preamplifier connected to the noise detection wiring, and
   the arithmetic circuit is configured to subtract the noise signal amplified by the second preamplifier from the electric signal amplified by the first preamplifier.

3. The charged particle beam control device according to claim 1, wherein
   the arithmetic circuit includes a preamplifier corresponding to the signal wiring, and a noise waveform adjustment circuit including a filter adjustment circuit configured to adjust a frequency characteristic of the noise signal and/or a gain adjustment circuit configured to adjust a gain of the noise signal.

4. The charged particle beam control device according to claim 1, wherein
   the signal wiring and the noise detection wiring are parallel wirings close to each other or twisted wirings twisted together.

5. The charged particle beam control device according to claim 1, wherein
   the termination circuit includes any one of a diode, a resistance element, a capacitor, an inductor, and a variable capacitance element.

6. A charged particle beam device comprising:
   a detector configured to detect secondary electrons and configured to output an electric signal based on the detected secondary electrons, wherein the detected secondary electrons is emitted from a sample by irradiating the sample with a charged particle beam;
   a signal wiring cg to transmit the electric signal;
   a noise detection wiring configured to detect a noise signal generated in the charged particle beam device; and
   an arithmetic circuit configured to generate a signal obtained by subtracting the noise signal from the electric signal;
   a bias power supply configured to supply a power supply voltage to the detector; and
   a data processing unit configured to control an output voltage of the bias power supply with a bias power supply control signal and set a parameter of the noise waveform adjustment circuit with a noise waveform adjustment signal, wherein
   the arithmetic circuit includes a preamplifier corresponding to the signal wiring, and a noise waveform adjustment circuit including a filter adjustment circuit configured to adjust a frequency characteristic of the noise signal and/or a gain adjustment circuit configured to adjust a gain of the noise signal, and
   when setting the parameter of the noise waveform adjustment circuit, the data processing unit sets the output voltage of the bias power supply to an off state with the bias power supply control signal, sets parameters of the noise waveform adjustment circuit with the noise waveform adjustment signal, compares a noise amount included in the signal output from the arithmetic circuit with a predetermined threshold value, resets the parameter when the noise amount is larger than the threshold value, and sets the voltage output of the bias power supply to an on state with the bias power supply control signal when the noise amount is equal to or smaller than the threshold value.

7. The charged particle beam control device according to claim 6, wherein
   the bias power supply is provided separately from the arithmetic circuit.

8. The charged particle beam control device according to claim 6, wherein
   the detector includes a main detector configured to detect the secondary electrons, and a termination circuit,
   the main detector is connected to a power supply line and the signal wiring, and the termination circuit is connected to the power supply line and the noise detection wiring.

9. The charged particle beam control device according to claim 8, wherein
the termination circuit is configured to adjust a frequency characteristic of an input impedance between the power supply line and the noise detection wiring based on an input impedance between the power supply line and the signal wiring.

10. The charged particle beam control device according to claim 8, wherein
the termination circuit includes any one of a diode, a resistance element, a capacitor, an inductor, and a variable capacitance element.

11. The charged particle beam control device according to claim 6, wherein
the signal wiring and the noise detection wiring are parallel wirings close to each other or twisted wirings twisted together.

12. A charged particle beam device comprising:
a detector configured to detect secondary electrons and configured to output an electric signal based on the detected secondary electrons, wherein the detected secondary electrons is emitted from a sample by irradiating the sample with a charged particle beam;
a signal wiring configured to transmit the electric signal;
a noise detection wiring configured to detect a noise signal generated in the charged particle beam device; and
an arithmetic circuit configured to generate a signal obtained by subtracting the noise signal from the electric signal;
a plurality of the detectors provided in the charged particle beam device; and
a plurality of the signal wirings respectively corresponding to the plurality of the detectors, wherein
the arithmetic circuit generates a signal obtained by subtracting the noise signal from the electric signal with respect to each electric signal supplied from a respective one of the detectors.

13. The charged particle beam control device according to claim 12, wherein
the arithmetic circuit includes a plurality of preamplifiers each respectively corresponding to one of the plurality of the signal wirings or the noise detection wiring, and
the arithmetic circuit is configured to subtract the noise signal amplified by the preamplifier corresponding to the noise detection wiring from the electric signals amplified by the respective preamplifiers corresponding to each of the plurality of signal wirings.

14. The charged particle beam control device according to claim 12, wherein
the arithmetic circuit includes a plurality of first preamplifiers each respectively corresponding to one of the plurality of the signal wirings, and noise waveform adjustment circuits that are provided respectively corresponding to the plurality of the signal wirings and that include filter adjustment circuits configured to adjust a frequency characteristic of the noise signal and/or gain adjustment circuits configured to adjust a gain of the noise signal.

15. The charged particle beam control device according to claim 14, further comprising:
a plurality of bias power supplies provided respectively corresponding to the plurality of the detectors, and configured to supply a power supply voltage to the corresponding detector; and
a data processing unit configured to control an output voltage of each bias power supply with a bias power supply control signal and set a parameter of each noise waveform adjustment circuit with a noise waveform adjustment signal, wherein
when setting the parameter of each noise waveform adjustment circuit, the data processing unit sets the output voltage of the corresponding bias power supply to an off state with the bias power supply control signal, sets the parameter of the noise waveform adjustment circuit with the noise waveform adjustment signal, compares a detection amount of the measured noise signal with a predetermined threshold value, resets the parameter when the detection amount of the noise signal is larger than the threshold value, and sets the voltage output of the corresponding bias power supply to an on state with the bias power supply control signal when the detection amount of the noise signal is equal to or smaller than the threshold value.

16. The charged particle beam control device according to claim 14, further comprising:
a second preamplifier provided between the noise detection wiring and the plurality of the noise waveform adjustment circuits.

17. The charged particle beam control device according to claim 12, wherein
the plurality of the signal wirings and the noise detection wiring are parallel wirings close to one another or twisted wirings twisted together.

* * * * *